COARSE-FINE PHASE LOCKED LOOP

Filed May 1, 1968 5 Sheets-Sheet 1

INVENTOR
ALAN R. GROENDYCKE
BY
Robert Thompson
ATTORNEY

Sept. 8, 1970 A. R. GROENDYCKE 3,528,026

COARSE-FINE PHASE LOCKED LOOP

Filed May 1, 1968 5 Sheets-Sheet 2

Sept. 8, 1970 A. R. GROENDYCKE 3,528,026

COARSE-FINE PHASE LOCKED LOOP

Filed May 1, 1968 5 Sheets-Sheet 5

United States Patent Office 3,528,026
Patented Sept. 8, 1970

3,528,026

COARSE-FINE PHASE LOCKED LOOP

Alan R. Groendycke, Los Angeles, Calif., assignor to Hughes Aircraft Company, Culver City, Calif., a corporation of Delaware Filed May 1, 1968, Ser. No. 726,646
Int. Cl. H03b 3/04
U.S. Cl. 331—11 12 Claims

ABSTRACT OF THE DISCLOSURE

A coarse-fine phase locked loop circuit for providing output signals such as television sync signals which are phase locked with a frequency burst input signal, comprising a coarse phase locked loop and a fine phase locked loop that are coupled to receive a frequency burst signal having a repetition rate which is harmonically related to the signal frequency. The coarse phase locked loop compares the phase difference of the repetition rate of the frequency burst signal with one feedback signal derived from the output of a voltage controlled oscillator and the fine phase locked loop compares the phase difference of the frequency signal of the frequency burst signal with another feedback signal derived from the output of the voltage controlled oscillator for generating error signals in response to the phase difference to control the phase of the voltage controlled oscillator.

BACKGROUND OF THE INVENTION

This invention relates in general to phase locked loops, and more particularly to a means for providing output signals such as television sync signals which are phase locked with a frequency burst input signal.

In certain applications, it is desirable to utilize a frequency burst signal. For example, in color television, a sync pulse is modulated with a color subcarrier reference frequency that is a submultiple of the horizontal line frequency, and the time interval between these bursts is used to transmit data such as a video signal which is phase dependent relative to the phase of the frequency burst signal components for proper demodulation.

SUMMARY OF THE INVENTION

Therefore, one object of this invention is to provide improvements in a circuit for generating a continuous frequency output signal that is continually phase locked with a frequency burst input signal.

Another object of this invention is to provide a means whereby two frequency output signals are phase locked with a frequency burst signal.

Yet another object of this invention is to provide a phase locked circuit of the above type which has the advantages of fast response time phase locking while obviating false locks on sideband frequencies.

The above and other objects of this invention can be attained by a circuit including a coarse phase locked loop and a fine phase locked loop that are coupled to receive a frequency burst signal having a repetition rate which is harmonically related to the signal frequency. The coarse phase locked loop compares the phase difference of the repetition rate of the frequency burst signal with one feedback signal derived from the output of a voltage controlled oscillator and the fine phase locked loop compares the phase difference of the frequency signal of the frequency burst signal with another feedback signal derived from the output of a voltage controlled oscillator.

Accordingly, one embodiment of the invention includes a coarse phase locked loop and a fine phase locked loop that phase compare the frequency burst input signal with respective feedback signals derived from the output signal of a voltage controlled oscillator and generate error signals that are analog summed and applied to the voltage controlled oscillator to shift the frequency and phase of the output signals into proper phase relationship with the frequency burst input signal.

In a second embodiment, a coarse phase locked loop and a fine phase locked loop operate such that the coarse phase locked loop compares the repetition rate of the frequency burst input signal with a first feedback signal derived from the output signal of a voltage controlled oscillator and feeds the resulting error signal to the voltage controlled oscillator when the phase error exceeds phase limits to quickly reduce the phase error to within the limits. Thereafter, the fine phase lock loop compares the frequency burst input signal with a feedback signal and generates an error signal which is fed to the voltage controlled oscillator to reduce the phase error to substantially zero.

Other objects, features and advantages of this invention will become apparent with reference to the following detailed description, taken in conjunction with the accompanying drawings, in which:

DESCRIPTION OF THE PREFERRED EMBODIMENTS

Figure 1:
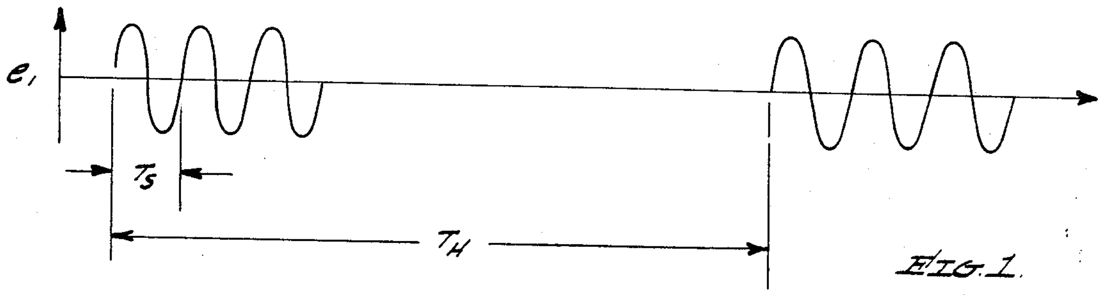
FIG. 1 is a signal diagram (not to scale) of a frequency burst input signal received by the coarse-fine phase locked loop circuit.

Referring now to the drawings in more detail, wherein like reference characters designate like or corresponding parts, there is shown in FIG. 1 a typical frequency burst input signal to the coarse-fine phase locked loop circuit. The input signal is a wave train of frequency bursts $F_H$ having a repetition rate $T_H$. Each frequency burst has a frequency signal $F_S$ of N cycles, each cycle having a period $T_S$. The following equations result:

$$F_H=\frac{1}{T_H} \qquad F_S=\frac{1}{T_S}$$

Thus, the frequency bursts have a repetition rate $T_H$, a signal frequency $F_S$, and sideband frequencies at $F_S \pm NF_H$, when $N=1, 2, 3 \ldots k$. In a particrlar embodiment $N=10$ cycles of $F_S$ in each frequency burst. Operationally, the frequency burst $F_H$ provides phase reference information for the coarse loop and the frequency signal $F_S$ provides phase reference information for the fine loop; and the time interval between frequency bursts can be used to transmit data, such as video information, that requires a phase reference for proper interpretation.

Figure 2:
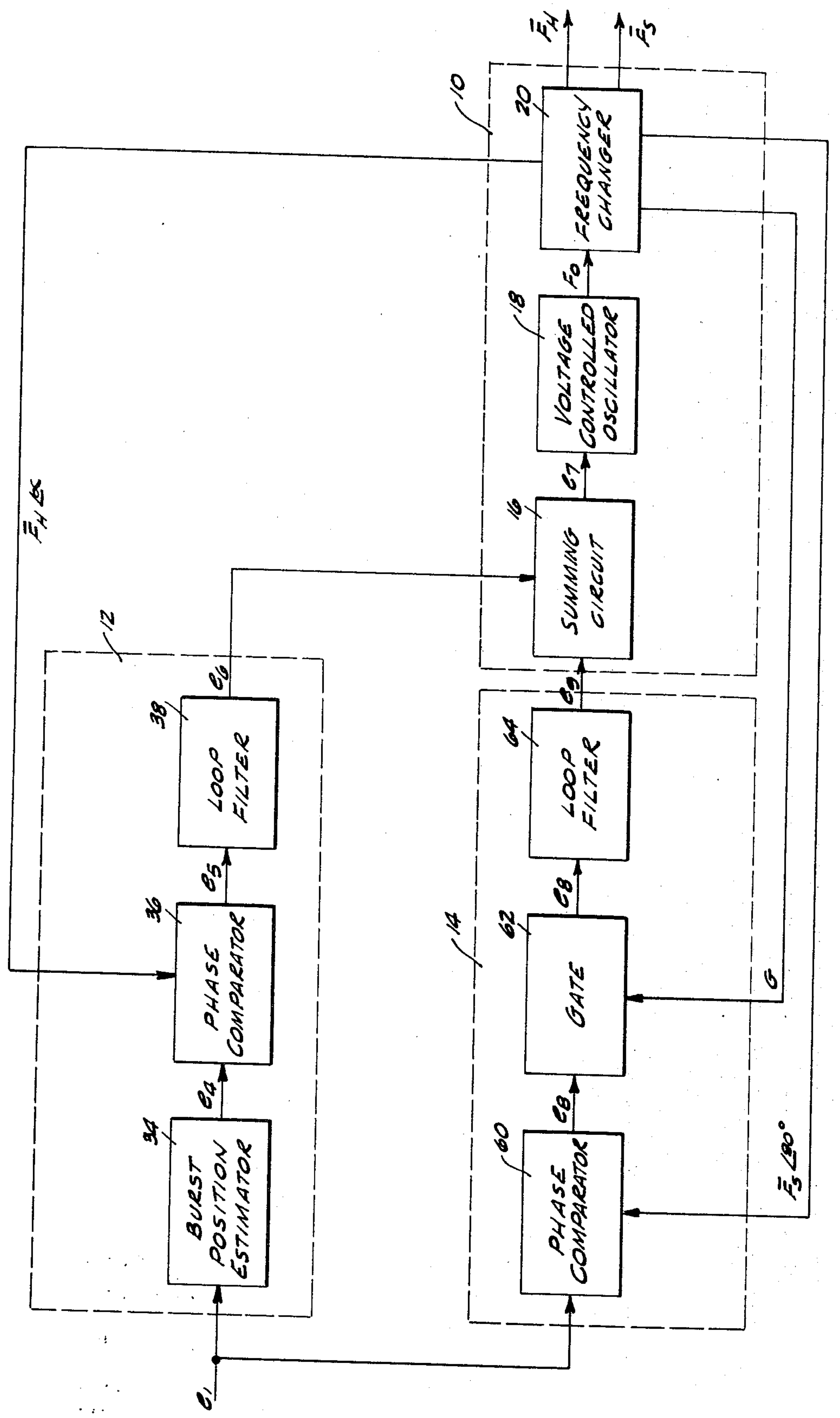
FIG. 2 is a block diagram of one embodiment of the coarse-fine phase locked loop circuit wherein error signals from a first phase detector means and a second phase detector means are analog summed in a signal generating means.

Referring now to FIG. 2, there is shown an embodiment of the coarse-fine phase locked loop circuit comprising a coarse loop and a fine loop with a signal generating means 10 which is common to both loops. In operation, the coarse loop includes a first phase detector means 12 and the signal generating means 10, and the fine loop includes a second phase detector means 14 and the signal generating means 10.

The signal generating means 10 is coupled to receive a coarse error signal $e_6$ from the first or coarse phase detector means 12 and a fine error signal $e_9$ frim a second or fine phase detector means 14, and generates a coarse output signal $\overline{F}_H$ and a fine output signal $\overline{F}_S$ and a plurality of feedback signals including a coarse feedback signal $\overline{F}_H\angle\alpha$, a fine feedbacks signal $\overline{F}_S\angle 90°$, and gate feedback signal G in response to the received error signals.

The coarse phase detector means 12 receives the course feedback signal $\overline{F}_H\angle\alpha$ and compares its phase with the received frequency burst signal $e_1$ for generating a coarse error signal $e_6$. The coarse error signal $e_6$ which is then fed to the signal generating means 10, relates to the phase difference between the received frequency burst $F_H$ and the coarse feedback signal $\overline{F}_H\angle\alpha$.

The fine phase detector means 14 receives the fine feedback signal $\overline{F}_S\angle 90°$ and phase compares it with the received frequency signal $F_S$ for generating the fine error signal $e_9$. The fine error signal $e_9$ is related to the phase difference between the frequency signal $F_S$ of the frequency burst signal and the fine feedback signal $\overline{F}_S\angle 90°$ and is fed to the signal generating means 10 when the gate feedback signal G is received Referring now to the details of the phase locked loop, as shown in FIG. 2, the signal generating means 10 includes a summing circuit 16, a voltage controlled oscillator 18, and a frequency changer 20 connected in series circuit relationship. The summing circuit 16 produces an output error signal $e_7$ having a voltage related to the received coarse and fine error signals $e$ and $e_9$, respectively. For example, when the summing circuit 16 receives the coarse error signal $e_6$ from the first phase detector means 12 and the fine error signal $e_9$ from the second phase detector means 14, it performs an analog voltage addition thereon and produces the output error signal $e_7$ which is fed to the voltage controlled oscillator 18. During the analog voltage addition the following signal relationship results:

$$e_7=e_6+e_9$$

As can be seen from the equation, if the coarse error signal $e_6$ or the fine error signal $e_9$ changes in value, the oltput error signal $e_7$ wil also change in value accordingly.

The summing circuit 16 is a conventional circuit and can be mechanized in a number of ways. Typical ways of mechanizing the summing circuit 16 are with a resistive summing circuit or with an operational amplifier summing circuit.

The voltage controlled oscillator 18 receives the output error signal $e_7$ from the summing circuit 16 and generates an output signal $F_O$ having a frequency proportional to the received error signal $e_7$. If error signal $e_7$ changes as a result of either $e_6$ or $e_9$ changing, the frequency of the generated output signal $F_O$ will change accordingly. The generated output signal $F_O$ from the voltage controlled oscillator 18 can be a continuous symmetric rectangular wave that is a fixed multiple of the frequency $F_S$ of the frequency burst.

For example, in certain color television applications, the frequency of the frequency signal $F_S$ is 3,579,545 cycles per second and the frequency of the generated output signal $F_O$ by the voltage controlled oscillator 18 would be $2F_S$ or 7,159,090. The voltage controlled oscillator 18 is a conventional electronic device and can be mechanized in a number of ways. A typical method for mechanizing the voltage controlled oscillator 18 is described in F. M. Gardner, Phaselock Techniques, New York; Wylie, 1966, pp. 66 through 70.

The frequency changer 20 is coupled to receive the output signal $F_O$ from the voltage controlled oscillator 18, for generating the coarse and the fine output signals $\overline{F}_H$ and $\overline{F}_S$ and the plurality of feedback signals including the coarse feedback signal $\overline{F}_H\angle\alpha$, the fine feedback signal $\overline{F}_S\angle 90°$ and the gate foodback signal G.

Figure 3:
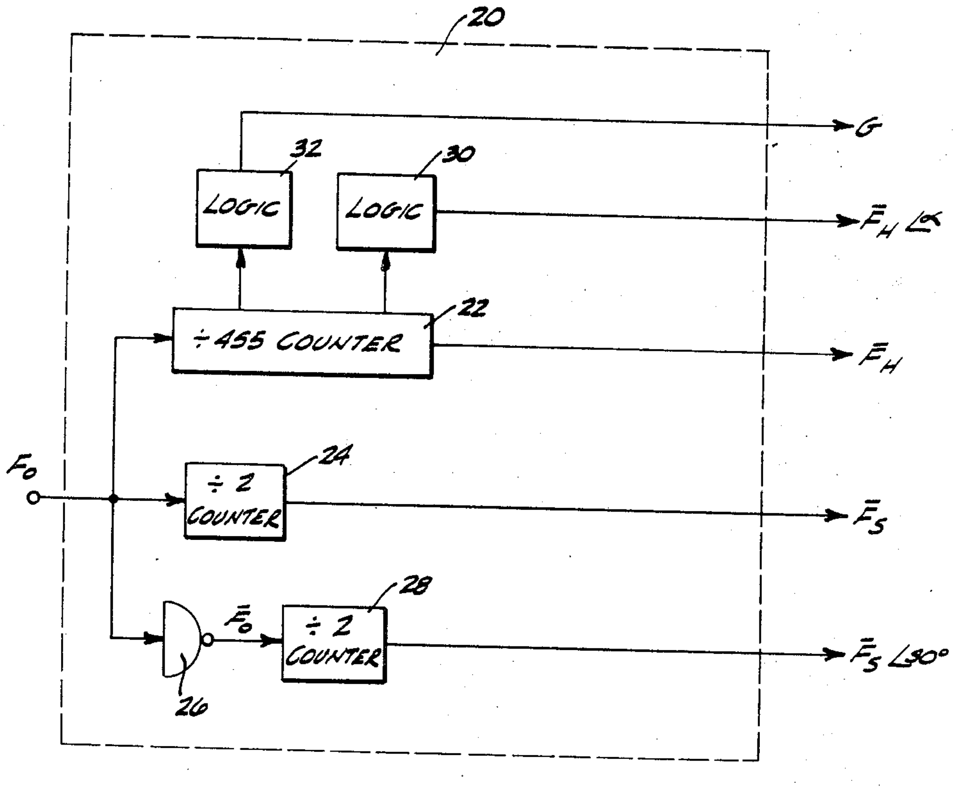
FIG. 3 is a logic diagram of the frequency changer illustrated in FIG. 2.

A typical technique for mechanizing the frequency changer illustrated in FIG. 2 by frequency divider circuits is shown in FIG. 3. If the output signal $F_O$ from the voltage controlled oscillator 18 is a symmetric rectangular wave output signal of $2F_S$, as described above, the following signal relationships would result when this embodiment is used for NTSC color television applications:

$$F_S=\frac{455}{2}F_H$$

$$F_S=3{,}579{,}545\pm0.0003\%\ F_H$$

$$F_H=15{,}734^+Hz.$$

$$F_O=2\overline{F}_S$$

The frequency changer 20 receives the voltage controlled oscillator's output signal $F_O$ at a common input terminal point whereupon the output signals $\overline{F}_H$ and $\overline{F}_S$ and feedback signals derived therefrom can be generated. Output signal $\overline{F}_H$ is generated by a divide by 455 counter 22 that is connected to receive the signal $F_O$ from the common input terminal. The divide by 455 counter 22 counts down the voltage controlled oscillator's output signal $F_O$ by 455 to generate $\overline{F}_H$. The following relationship results:

$$\overline{F}_H=\frac{F_O}{455}$$

Output signal $\overline{F}_S$ is generated by a divide by 2 counter 24 that is connected to receive the signal $F_O$ from the common input terminal. The divide by 2 counter 24 can be a bistable flip-flop that is triggered on negative going edges of signal $F_O$ to count down the voltage controlled oscillator's output signal $F_O$ by 2 and generate the output signal $\overline{F}_S$. The following equation results:

$$\overline{F}_S=\frac{F_O}{2}$$

The fine feedback signal $\overline{F}_S\ \angle 90°$ is generated by a circuit including an inverter gate 26 and a divide by 2 counter 28, connected in series circuit relationship. The inverter gate 26 is connected to receive the signal $F_O$ from the common input terminal for generating the signal complement of the voltage controlled oscillator's output signal $F_O$. The divide by 2 counter 28 is a bistable flip-flop which is triggered by the negative going edges of the signal complement $\overline{F}_O$ of the voltage controlled oscillator's output signal $F_O$ from the inverter gate for dividing the signal by 2 to obtain the fine feedback signal $\overline{F}_S\angle 90°$.

The coarse feedback signal $\overline{F}_H\ \angle\alpha$ and the gate feedback signal G are generated by logic circuits 30 and 32 connected to selected pickoff points in the divide by 455 counter 22. Logic circuit 30 is connected to one pickoff point in the divide by 455 counter 22 for generating the coarse feedback signal $\overline{F}_H\angle\alpha$. As will become apparent with reference to the operation of the burst position estimator 34, $\angle\alpha$ is necessary to compensate for delays which occur when an envelope detection operation occurs as a result of filtering and threshold detection, as will be explained in more detail shortly. Logic circuit 32 is connected to another pickoff point in the divide by 455 counter 22 to generate feedback gate signal G having a duration and pulse position sufficient to pass only the frequency signal $F_S$ so that only the frequency signal $F_S$ is phase compared.

Techniques for mechanizing the digital counters and logic gates are described in Montgomery J. R. Phister, Logic Design of Digital Computers, New York; Wiley, 1958. Further techniques are described by Gerald A. Maley and John Earle, The Logical Design of Transistor Digital Computers, New Jersey, Prentice-Hall, Inc. 1963.

The first or coarse loop phase detector means 12, as illustrated in FIG. 2, includes a burst position estimator 34, a phase comparator 36, and a loop filter 38, connected in series circuit relationship. In operation, the burst position estimator 34 receives the frequency burst signal $e_1$ and converts it into a pulse $e_4$ of a specific magnitude equal to the magnitude of the course feedback signal $\overline{F}_H\angle\alpha$, and the duration of the pulse $e_4$ is fixed relative to the number of cycles N of the frequency signal $F_S$ in the frequency burst signal $e_1$.

Figure 4:
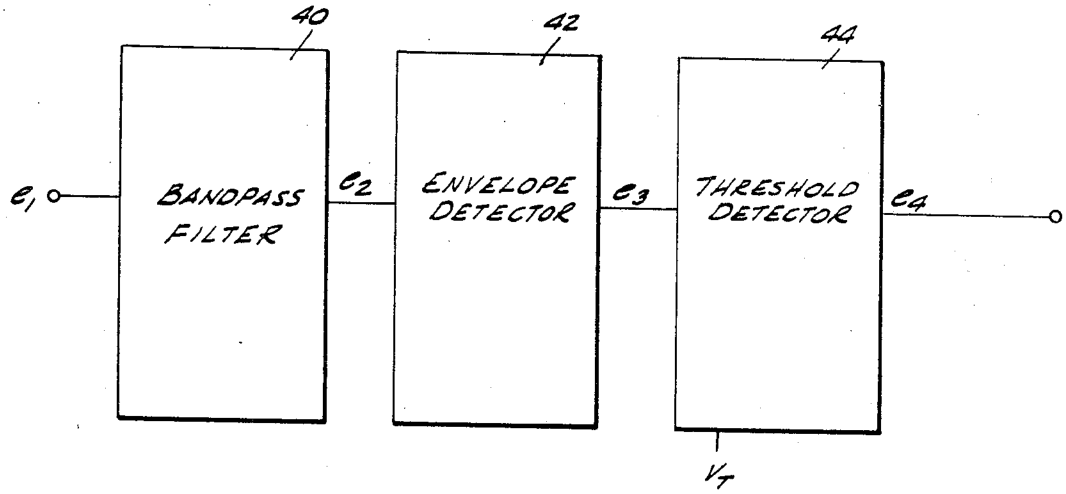
FIG. 4 is a block diagram of the burst position estimator illustrated in FIG. 2.

The burst position estimator 34 can be constructed in a number of ways. One way of constructing the burst position estimator 34 is with a bandpass filter 40, an envelope detector 42, and a threshold detector 44, as illustrated in FIG. 4. Typical techniques for constructing the bandpass filter 40 and the envelope detector 42 are described in L. B. Arguimbau, Vacuum Tube Circuits and Transistors, New York, Wiley, 1956, pp. 240F and 445. The threshold detector 44 can be mechanized with integrated circuit comparators such as a Fairchild μA710 Comparator, manufactured by Fairchild Semiconductor Corporation and described in their brochure, μA710 High-Speed, Differential Comparator SL–162, November 1965. In operation, the bandpass filter 40 attenuates all frequencies outside the frequency limits of the frequency signal $F_S$. The envelope detector 42 rectifies the output signal $e_2$ of the bandpass filter 40 and produces an envelope output signal $e_3$ proportional to the peaks of the frequency signal $F_S$. The threshold detector 44 receives the envelope output $e_3$ of frequency signal $F_S$ and triggers on and off at a threshold voltage $V_T$ of the envelope and provides a rectangular pulse output $e_4$. Even though there is a slight delay between the leading edge of the pulse output $e_4$ and the envelope output $e_3$, because of the threshold detection operation, the $\angle\alpha$ of the coarse feedback signal $\overline{F}_H\angle\alpha$ will compensate for it.

The coarse phase comparator 36 receives and compares the pulse output $e_4$ from the burst position estimator 34 with the coarse feedback $\overline{F}_H\angle\alpha$ and provides an output signal $e_5$ having an average value proportional to the phase difference between the received signals.

Figure 5:
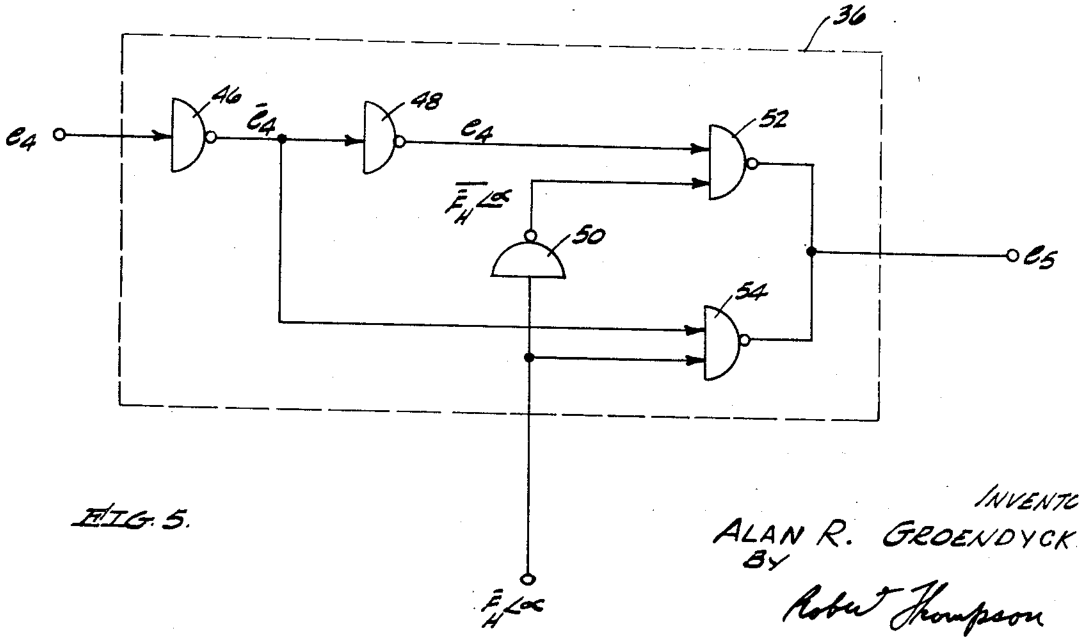
FIG. 5 is a logic diagram of the coarse phase comparator illustrated in FIG. 2.

FIG. 5 illustrates one way of constructing the phase comparator 36 using digital gates such as 946DTμL integrated circuit gates that are manufactured by Fairchild Semiconductor Company and described in their brochure, "DTμL Quad to Input Gate Element," dated August 1964.

More specifically, gate 46 receives pulse signal $e_4$ from the burst position estimator 34 to provide circuit matching compatibility with the output of the threshold detector 44 in the burst position estimator 34 and inverts it to produce a pulse signal complement $\overline{e}_4$. Gate 48 receives the pulse signal complement $\overline{e}_4$ from gate 46 and inverts it to reproduce the pulse signal $e_4$. Gate 50 receives the coarse feedback signal $\overline{F}_H\angle\alpha$ from the frequency changer 20 (FIG. 2) and inverts it to produce a coarse feedback signal complement $$\overline{\overline{F}_H\angle\alpha}$$

of the feedback signal. Gate 52 is coupled to receive pulse signal $e_4$ from gate 48 and coarse feedback signal complement $$\overline{\overline{F}_H\angle\alpha}$$

from gate 50, and performs a NAN gate operation and inversion on the received signals, to generate an output signal $$\overline{e_4\cdot\overline{\overline{F}_H\angle\alpha}}$$

Gate 54 is coupled to receive pulse signal complement $\overline{e}_4$ from gate 46 and the coarse feedback signal $\overline{F}_H\angle\alpha$, performs a NAND gate operation and inversion on the received signals, to generate an output signal $$\overline{\overline{e}_4\cdot\overline{F}_H\angle\alpha}$$

Gate 52 and gate 54 are connected in parallel circuit relationship with on another to form a logic function phase sensing operation to generate the phase error signal $e_5$ which is equal to the logic addition of the output signals from gate 52 and gate 54, or:

$$e_5=\overline{e_4\cdot\overline{\overline{F}_H\angle\alpha}\cdot\overline{\overline{e}_4\cdot\overline{F}_H\angle\alpha}}$$

When the coarse output signal $\overline{F}_H$ is in phase with the frequency burst $F_H$ the leading edge of the coarse feedback signal $\overline{F}_H\angle\alpha$ is positioned midway between the leading and trailing edges of the pulse signal $e_4$ whereupon a phase error signal $e_5$ having an average value equal to a reference level, is generated. However, if the coarse output signal $\overline{F}_H$ is out of phase, the feedback signal $\overline{F}_H\angle\alpha$ is also out of phase a like amount. As a result, the average value fo the phase error signal $e_5$ will become either more positive or more negative, depending upon the direction of the phase deviation.

The coarse loop phase comparator 36 can be constructed in a number of other ways. Typical methods for constructing the coarse loop phase comparator 36 are described in F. M. Gardner, Phaselock Techniques, New York, Wiley, 1966, pp. 52 through 66.

The coarse loop filter receives the phase error signal $e_5$ from the phase comparator 36 and provides an output signal $e_6$ proportional to the arithmetic mean of the received signal. Loop filters for this function can take a number of forms, such as, for example, those described in the previously referenced Phaselock Techniques, New York, Wiley, 1966, pp. 8 and 9.

Figure 6:
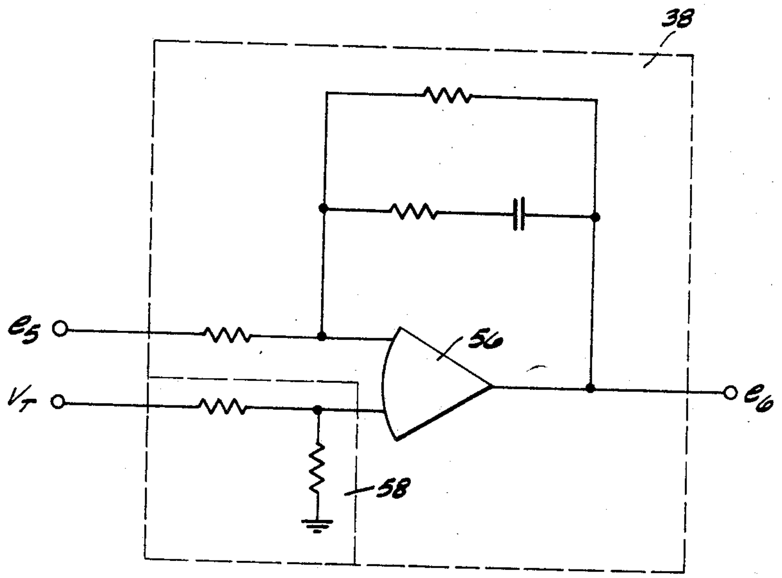
FIG. 6 is a schematic diagram of the coarse loop filter illustrated in FIG. 2.

FIG. 6 illustrates one circuit that can be used for the coarse loop filter 38. The circuit, with the exception of voltage divider resistors 58, having a pickoff coupled to one input of an amplifier 56, is fully described by F. J. Charles and W. C. Lindsey, "Some Analytical and Experimental Phase-Locked Loop Results for Low Signal-to-Noise Ratios," Proceedings of the IEEE, September 1966, vol. 54, pp. 1152 to 1154. The pickoff voltage of the voltage divider resistors 58 is fed to one input of the amplifier 56 to set the zero reference of the loop filter 38 to agree with the zero reference of the phase comparator 36.

Referring now to the details of the second or fine phase locked loop, the second or fine loop phase detector means 14 comprises a second phase comparator 60, a gate 62, and a second loop filter 64, connected in series circuit relationship. In operation, the fine phase comparator 60 receives the frequency burst signal $E_1$ and the fine feedback signal $\overline{F}_S\angle 90°$ and generates a phase error signal $e_8$ related to the phase difference between the received signals. Phase error signal $e_8$ can be a rectangular wave of the same frequency as the frequency of the frequency signal $F_S$.

Figure 7:
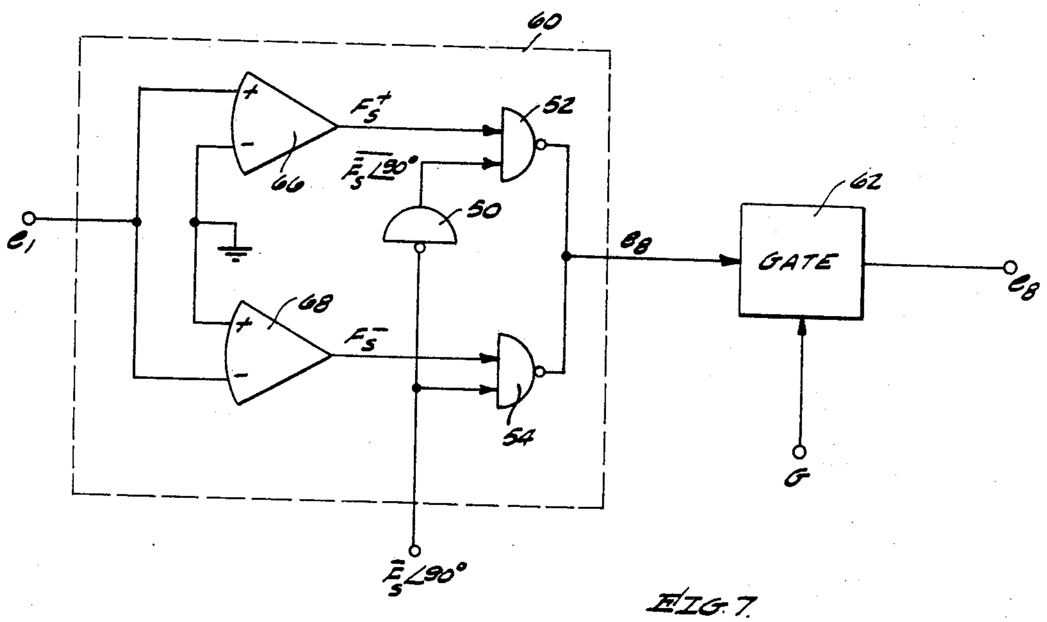
FIG. 7 is a logic diagram of the fine phase comparator and the gate illustrated in FIG. 2.

A typical fine phase comparator 60 is shown in FIG. 7 wherein voltage comparator 66 and voltage comparator 68 receive the frequency signal F and rectify it to produce square wave output signals that are related to the positive and negative portions of the frequency signal $F_S$ respectively. Comparator 66 produces a positive square signal $F_S^+$ having positive going pulses that correspond to the positive portion of the frequency signal $F_S$. Comparator 68 produces a negative square wave signal $F_S^-$ having negative going pulses that correspond to the negative portions of the frequency signal $F_S$. Gate 50 receives the fine feedback signal $\overline{F}_S\angle 90°$ from the frequency changer 20 (FIG. 2), and inverts it to produce a fine feedback signal complement $$\overline{\overline{F}_S\angle 90°}$$

of the received feedback signal $\overline{F}_S\angle 90°$. Gate 52 is coupled to receive the positive square wave signal $F_S^+$ from comparator 66 and the fine feedback signal complement $$\overline{\overline{F}_S \angle 90°}$$

from gate 50 and performs NAND operation and inversion on the received signals to generate an output signal $$\overline{F_{S+} \cdot \overline{\overline{F}_S \angle 90°}}$$

Gate 54 is coupled to receive the negative square wave signal $F_S^-$ from comparator 68 and fine feedback signal $\overline{F}_S \angle 90°$ and performs a NAND operation and inversion on the received signals to generate an output signal $$\overline{F_S^- \cdot \overline{F}_S \angle 90°}$$

Gate 52 and gate 54 are connected in parallel circuit relationship with one another with their output connected together to form a logic function phase sensing opertaion to generate the phase error signal $e_8$ which is equal to the logic addition of the output signals from gate 52 and gate 54, or:

$$e_8 = \overline{F_S^+ \cdot \overline{\overline{F}_S \angle 90°}} \cdot \overline{F_S^- \cdot \overline{F}_S \angle 90°}$$

When the fine output signal $\overline{F}_S$ is in phase with the frequency signal $F_S$ the leading edges of the pulses of the fine feedback signal $\overline{F}_S \angle 90°$ are positioned midway between the leading and trailing edges of the positive square wave signal $F_S^+$ and the negative square wave signal $F_S^-$ whereupon a phase error signal $e_8$ having an average value equal to a reference level, is generated. However, if the fine output signal $\overline{F}_S$ is out of phase, the feedback signal $\overline{F}_S \angle 90°$ is also out of phase a like amount. As a result the average value of the phase error signal $e_8$ will become either more positive or more negative, depending upon the direction of the phase deviation.

The gate 62 receives the fine error signal $e_8$ from the fine phase comparator 60 and the gate feedback signal G.

The gate feedback signal G operates to control the conduction of the phase error signal $E_8$ from the second phase comparator 60 only when the frequency burst signal $e_1$ is received by the second phase comparator 60. Since the phase error signal $e_8$ from the second phase comparator 60 is generated only when the frequency burst signal $e_1$ is received, an error signal related to the phase difference between the frequency signal $F_S$ and the fine feedback signal $\overline{F}_S \angle 90°$ are applied to the gate 62.

The gate 62 can be an analog switch which conducts the error signal $e_8$ such as, for example, a Fairchild SH3001 hybrid circuit, manufactured by Fairchild Semiconductor Company and described in their brochure SH3001, Analog Switch, SL–189, January 1966.

The fine loop filter 64 is substantially the same as the first loop filter 38 except that the values of the resistors and capacitors can be different to achieve the proper circuit dynamics. The output of the fine loop filter 64 is an error signal $e_9$ having a value proportional to the arithmetic means of the received error signal $e_8$.

Figure 8:
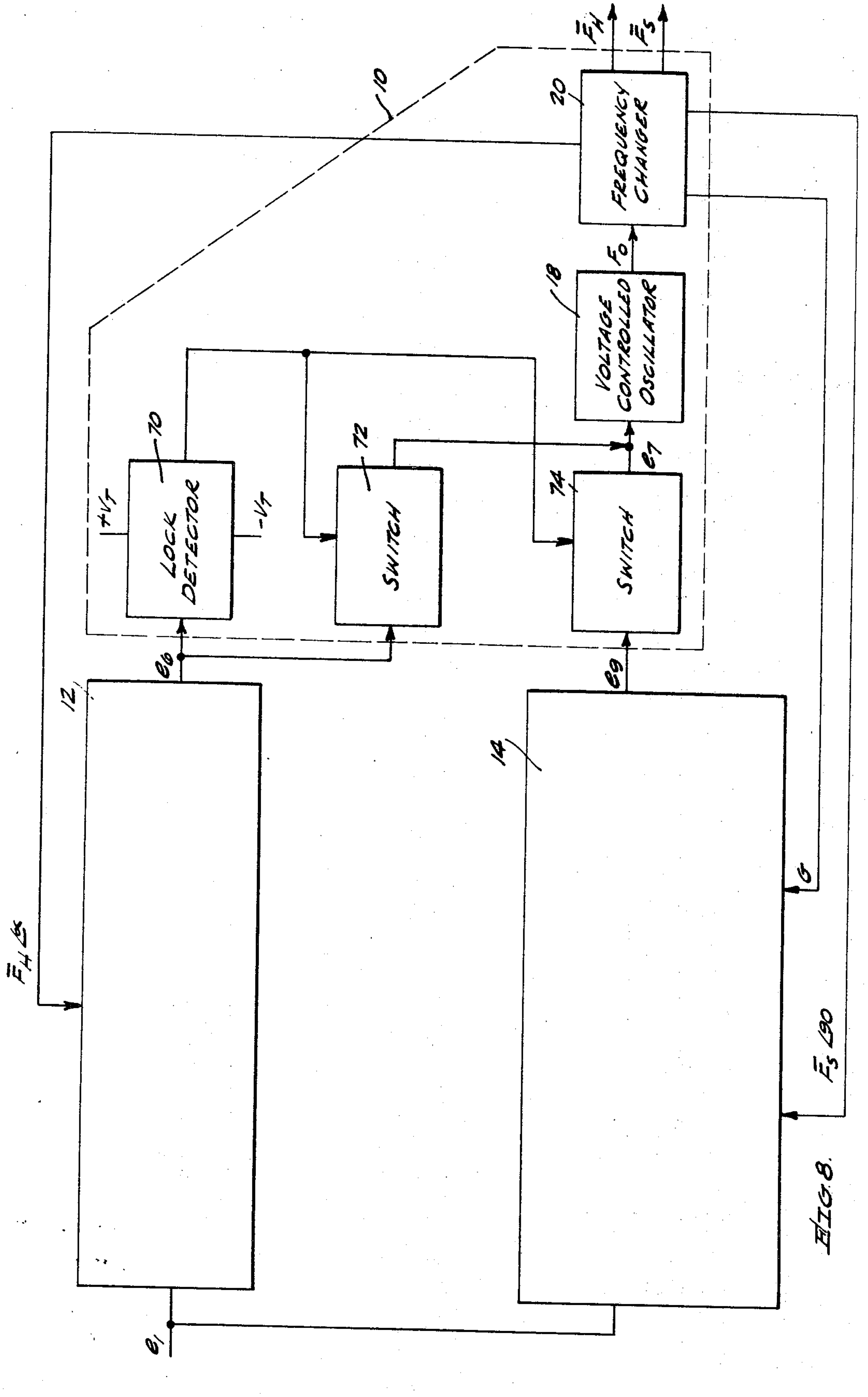
FIG. 8 is a block diagram of another embodiment of the coarse-fine phase locked loop circuit wherein error signals from a first phase detector means or a second phase detector means are selected in the signal generating means and fed to a voltage controlled oscillator.

Now referring to FIG. 8, there is shown another embodiment of this invention. In this embodiment, the coarse phase detector means 12 and the fine phase detector means 14 operate as described for FIG. 2. However, in this embodiment, only the error signal $e_6$ from the coarse loop, or the error signal $e_9$ from the fine loop is applied to the voltage controlled oscillator 18 at any one instant of time.

To apply only one of the error signals received by the signal generating means 10 to the voltage controlled oscillator 18 a threshold logic switching circuit is used. The switching circuit comprises a lock detector 70, a first swtch 72, and a second switch 74. The lock detector 70 has a positive threshold voltage $+V_T$ and a negative threshold voltage $-V_T$. When the error signal $e_6$ from the first phase detector means 12 is more positive than the positive threshold voltage $+V_T$ or more negative than the threshold voltage $-V_T$ the lock detector 70 produces an output signal which enables a first switch 72 and inhibits a second switch 74. When the first switch 72 is enabled, only coarse error signal $e_6$ is conducted to the voltage controlled oscillator 18.

However, when the error signal $e_6$ from the first phase detector means 12 is less positive than the positive threshold voltage $+V_T$ or less negative than the negative threshold voltage $-V_T$ the lock detector 70 produces a signal which enables the second switch 74 and inhibits the first switch 72. When the second switch 74 is enabled, only the fine error signal $e_9$ from the second detector means 14 is conducted to the voltage controlled oscillator 18. A typical switch that can be used for the first switch 72 and the second switch 74 is an SH3001, manufactured by Fairchild Semiconductor Company and described in their brochure SH3001, Analog Switch, S1–189, January 1966.

While the salient features have been illustrated and described with respect to particular embodiments, it should be readily apparent that modifications can be made within the spirit and scope of the invention, and it is therefore not desired to limit the invention to the exact details shown and described.

What is claimed is:

1. A phase locked loop for receiving a frequency burst signal comprising:

a variable frequency oscillator coupled to receive error signals for producing an output signal having a frequency related to the amplitude of the received error signal, and a frequency changer coupled to receive the output signal from said variable frequency oscillator for providing a plurality of feedback signals related to the repetition rate and the frequency of the frequency burst signal in response to the error signals;

a first phase detector means coupled to receive the frequency burst signal and to receive a first of the plurality of feedback signals related to the repetition rate of the frequency burst signal for producing an error signal related to the phase difference between the received signals;

a second phase detector means coupled to receive the frequency burst signal and a second of the plurality of feedback signals related to the frequency of the frequency burst signal for producing an error signal related to the phase difference between the received signals.

2. The circuit of claim 1 in which said first phase detector means includes:

pulse shaping means coupled to receive the frequency burst signal for providing a pulse signal output related to the repetition rate of the frequency burst signal; and a first phase comparator means coupled to receive the pulse signal from said pulse shaping means and the first feedback signal for generating one of the error signals related to the phase difference between the received signals.

3. The circuit of claim 2 in which said second phase detector means includes:

a second phase comparator means coupled to receive the frequency signal of the frequency burst signal and the second feedback signal for generating an error signal related to the phase difference between the received signals; and a gate coupled to receive the error signal from said second phase comparator means and a third feedback signal for conducting the received error signal to said variable frequency oscillator when the third feedback signal is received.

4. The circuit of claim 2 in which said second phase detector means includes:

a second phase comparator means coupled to receive the frequency signal of the frequency burst signal and the second feedback signal for generating an error signal related to the phase difference between the received signals; and a gate coupled to receive the error signal from said second phase comparator means and a third feedback signal for conducting the received error signal to said variable frequency oscillator when the third feedback signal is received.

5. The circuit of claim 4 in which said signal generating means further includes:

a circuit coupled to receive the error signal from said first phase detector means and the error signal from said second phase detector means for combining the received error signals for producing an error signal output related to the sum of the received error signals to feed the error signal output to said variable frequency oscillator.

6. The circuit of claim 5 in which said first phase detector means further includes:

a first filter circuit coupled to receive the error signal from said first phase comparator means for averaging the received error signal, and feeding the averaged error signal to said circuit for combining the received error signals.

7. The circuit of claim 5 in which said second phase detector means further includes:

a second filter circuit coupled to receive the error signal conducted by said gate for averaging the received error signal and feeding the averaged error signal to said circuit for combining the received error signals.

8. The circuit of claim 6 in which said second phase detector means further includes:

a second filter circuit coupled to receive the error signal conducted by said gate for averaging the received error signal and feeding the averaged error signal to said circuit for combining the received error signals.

9. The circuit of claim 2 in which said signal generating means further includes:

a circuit coupled to receive the error signal from said first phase detector means for conducting the error signal from said first phase detector means to said variable frequency oscillator when the error signal from said first detector means exceeds threshold limits and conducting the error signal from said second phase detector means to said variable frequency oscillator when the error signal from said first phase detector means is less than the threshold limits.

10. The circuit of claim 9 in which said first phase detector means includes:

pulse shaping means coupled to receive the frequency burst signal for providing a pulse signal output related to the repetition rate of the frequency burst signal; and a first phase comparator means coupled to receive the pulse signal from said pulse shaping means and the first feedback signal for generating one of the error signals related to the phase difference between the received signals.

11. The circuit of claim 10 in which said second phase detector means includes:

a second phase comparator means coupled to receive the frequency signal of the frequency burst signal and the second feedback signal for generating an error signal related to the phase difference between the received signals; and a gate coupled to receive the error signal from said second phase comparator means and a third feedback signal for conducting the received error signal to said variable frequency oscillator when the third feedback signal is received.

12. The circuit of claim 9 in which said second phase detector means includes:

a second phase comparator means coupled to receive the frequency signal of the frequency burst signal and the second feedback signal for generating an error signal related to the phase difference between the received signals; and a gate coupled to receive the error signal from said second phase comparator means and a third feedback signal for conducting the received error signal to said variable frequency oscillator when the third feedback signal is received.

References Cited

UNITED STATES PATENTS

| | | | |
|---|---|---|---|
| 2,740,046 | 3/1956 | Tellier | 331—11 |
| 3,023,370 | 2/1962 | Waller | 331—11 |

FOREIGN PATENTS

| | | |
|---|---|---|
| 1,022,766 | 3/1966 | Great Britain. |

JOHN KOMINSKI, Primary Examiner

U.S. Cl. X.R.

178—69.5; 331—14, 20